United States Patent
Lee

(10) Patent No.: US 8,354,345 B2
(45) Date of Patent: Jan. 15, 2013

(54) METHOD FOR FORMING SIDE CONTACT IN SEMICONDUCTOR DEVICE THROUGH SELF-ALIGNED DAMASCENE PROCESS

(75) Inventor: Sang-Oh Lee, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 206 days.

(21) Appl. No.: 12/777,572

(22) Filed: May 11, 2010

(65) Prior Publication Data

US 2011/0130004 A1 Jun. 2, 2011

(30) Foreign Application Priority Data

Nov. 30, 2009 (KR) ........................ 10-2009-0117437

(51) Int. Cl.
*H01L 21/311* (2006.01)
(52) U.S. Cl. .......... 438/696; 257/E21.241; 257/E21.246
(58) Field of Classification Search .................. 438/585, 438/221, 702, 703, 337, 243, 259, 269, 270, 438/700, 666; 257/E29.121, E21.244, E21.585, 257/E21.653, E21.419, E21.428, E21.246
See application file for complete search history.

(56) References Cited

U.S. PATENT DOCUMENTS

| | | | | | |
|---|---|---|---|---|---|
| 5,519,236 | A  * | 5/1996 | Ozaki | ........................ | 257/302 |
| 6,573,137 | B1 * | 6/2003 | Divakaruni et al. | .......... | 438/248 |
| 6,630,379 | B2 * | 10/2003 | Mandelman et al. | ......... | 438/243 |
| 7,960,241 | B2 * | 6/2011 | Huang et al. | .................. | 438/386 |
| 2002/0066917 | A1 * | 6/2002 | Jaiprakash et al. | ........... | 257/301 |
| 2002/0068400 | A1 * | 6/2002 | Kunkel et al. | ................... | 438/243 |
| 2002/0090824 | A1 * | 7/2002 | Jaiprakash et al. | ............ | 438/700 |
| 2002/0149047 | A1 * | 10/2002 | Divakaruni et al. | .......... | 257/302 |
| 2003/0169629 | A1 * | 9/2003 | Goebel et al. | .................. | 365/200 |
| 2005/0124111 | A1 * | 6/2005 | Huang et al. | ................... | 438/241 |
| 2005/0164446 | A1 * | 7/2005 | Lin et al. | ........................ | 438/243 |
| 2006/0258084 | A1 * | 11/2006 | Tang et al. | ..................... | 438/239 |
| 2010/0090264 | A1 * | 4/2010 | Moll et al. | ..................... | 257/301 |
| 2011/0073940 | A1 * | 3/2011 | Lee et al. | ....................... | 257/332 |
| 2011/0104894 | A1 * | 5/2011 | Kim et al. | ..................... | 438/666 |
| 2011/0129975 | A1 * | 6/2011 | Lee | ............................... | 438/270 |
| 2011/0151666 | A1 * | 6/2011 | Ko | ................................. | 438/664 |

FOREIGN PATENT DOCUMENTS

KR 100398304 9/2003

OTHER PUBLICATIONS

Notice of Preliminary Rejection issued from Korean Intellectual Property Office on Mar. 30, 2011.

* cited by examiner

*Primary Examiner* — Matthew Landau
*Assistant Examiner* — Latanya N Crawford
(74) *Attorney, Agent, or Firm* — IP & T Group LLP

(57) ABSTRACT

A method for fabricating a semiconductor device includes forming a plurality of active regions, each having a first sidewall and a second sidewall, by etching a semiconductor substrate, forming an insulation layer on the first sidewall and the second sidewall, forming an etch stop layer filling a portion of each gap between the active regions, forming a recess exposing the insulation layer formed on any one sidewall from among the first sidewall and the second sidewall, and forming a side contact exposing a portion of any one sidewall from among the first sidewall and the second sidewall by selectively removing a portion of the insulation layer.

18 Claims, 12 Drawing Sheets

METHOD FOR FORMING SIDE CONTACT IN SEMICONDUCTOR DEVICE THROUGH SELF-ALIGNED DAMASCENE PROCESS

CROSS-REFERENCE TO RELATED APPLICATIONS

The present application claims priority of Korean Patent Application No. 10-2009-0117437, filed on Nov. 30, 2009, which is incorporated herein by reference in its entirety.

BACKGROUND OF THE INVENTION

Exemplary embodiments of the present invention relate to a method for fabricating a semiconductor device, and more particularly, to a method for forming a side contact in a semiconductor device.

Pattern shrinkage is essential for the improvement of throughput. Pattern shrinkage requires masks to become smaller and smaller. To this end, an argon fluoride (ArF) photoresist (PR) layer has been introduced into the fabrication of semiconductor devices of under 40 nm. However, pattern shrinkage has increased, and the ArF photoresist has reached its limitation as well.

Memory devices, such as Dynamic Random Access Memory (DRAM), require new patterning technology, and accordingly, three-dimensional (3D) cell forming technology is being introduced.

A conventional metal-oxide semiconductor field effect transistor (MOSFET) including planar channels cannot be shrunken even further because the shrinkage of a memory device has come to physical limitations in terms of leakage current, on-current, short-channel effect, and the like. To overcome the problem, researchers are seeking to develop semiconductor devices employing vertical channels.

Semiconductor devices employing vertical channels include channels laid as a perpendicular structure which are formed by forming a pillar-shaped active region extended vertically from a substrate, and a surround-type gate electrode, which is referred to as a vertical gate (VG), surrounding the area around the active region. These semiconductors further include junction regions (i.e., a source region and a drain region) in the upper portion and the lower portion of the active region around the gate electrode. Any one of the junction regions is coupled with a buried bit line (BBL).

FIG. 1 is a cross-sectional view illustrating a semiconductor device having vertical channels according to prior art.

Referring to FIG. 1, a plurality of pillar structures each include a pillar-shaped active region 12, which extends vertically from a substrate 11, and a hard mask layer 13. The external wall of the active region 12 is surrounded by a gate insulation layer 14 and a vertical gate 15. A buried bit line 16 is formed by ion-implanting an impurity into the substrate 11. An interlayer dielectric layer 18 is formed to be buried inside of a trench 17 to separate the buried bit line 16 from a neighboring buried bit line.

Although the conventional semiconductor device employing vertical channels shown in FIG. 1 implants a dopant through ion implantation to form the buried bit line 16, there is a limitation in decreasing the resistance of the buried bit line 16 by implanting a dopant alone when a semiconductor device shrinks. The dopant implantation may deteriorate the characteristics of the semiconductor device if the resistance of the buried bit line 16 is to be decreased in a shrunken semiconductor device.

To overcome the drawback, a technology for decreasing resistance by forming the buried bit line from a metal has been suggested recently. According to the suggested technology, since the buried bit line is a metal layer, an Ohmic-like contact should be achieved between an active region and a buried bit line.

To achieve the Ohmic-like contact, a side contact forming process, which exposes any one sidewall of the active region, is required.

A side contact should be formed on any one sidewall in the lower portion of the active region to couple the active region and the buried bit line, because the height of the buried bit line is low.

However, since the width of the active region is decreased and the depth becomes deeper as a semiconductor device is integrated higher and higher, it is difficult to form a side contact which selectively exposes any one sidewall of an active region. Even if such side contact is formed, there is a limitation in forming the side contact at a uniform depth.

SUMMARY OF THE INVENTION

Exemplary embodiments of the present invention, which is designed to address the concerns of the conventional technology, are directed to a semiconductor device fabrication method that can form a side contact to selectively expose any one sidewall of an active region and form the side contact at a desired position with a uniform depth.

In accordance with an exemplary embodiment of the present invention, a method for fabricating a semiconductor device includes forming a plurality of active regions, each having a first sidewall and a second sidewall, by etching a semiconductor substrate, forming an insulation layer on the first sidewall and the second sidewall, forming an etch stop layer filling a portion of each gap between the active regions, forming a recess exposing the insulation layer formed on any one sidewall from among the first sidewall and the second sidewall, and forming a side contact exposing a portion of any one sidewall from among the first sidewall and the second sidewall by selectively removing a portion of the insulation layer.

In accordance with another exemplary embodiment of the present invention, a method for fabricating a semiconductor device includes forming a plurality of active regions, each having a first sidewall and a second sidewall, by using a hard mask pattern as an etch barrier and etching a semiconductor substrate, forming an insulation layer on the first sidewall and the second sidewall, forming an etch stop layer filling a portion of each gap between the active regions, forming a sacrificial layer filling a gap over the etch stop layer, forming a sacrificial pattern providing a first recess by etching a portion of the sacrificial layer, forming an etch barrier filling the first recess, forming a second recess exposing the insulation layer formed on any one sidewall from among the first sidewall and the second sidewall by removing the sacrificial pattern, and forming a side contact exposing a portion of any one sidewall from among the first sidewall and the second sidewall by selectively removing a portion of insulation layer.

DESCRIPTION OF SPECIFIC EMBODIMENTS

Figure 1:
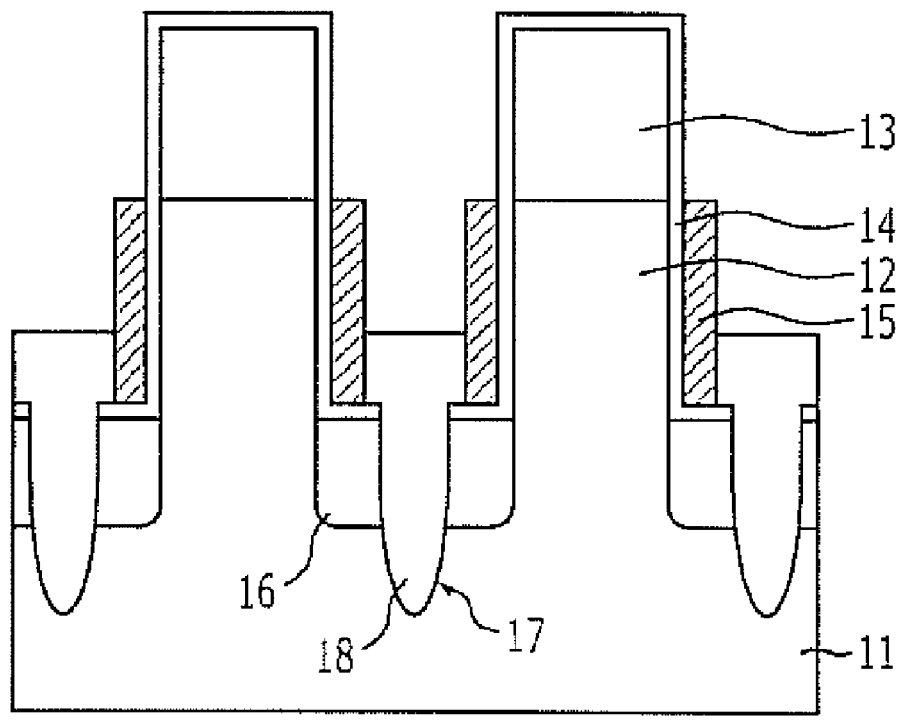
FIG. 1 is a cross-sectional view illustrating a semiconductor device having vertical channels according to prior art.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate, but also a case where a third layer exists between the first layer and the second layer or the substrate.

Figure 2A:
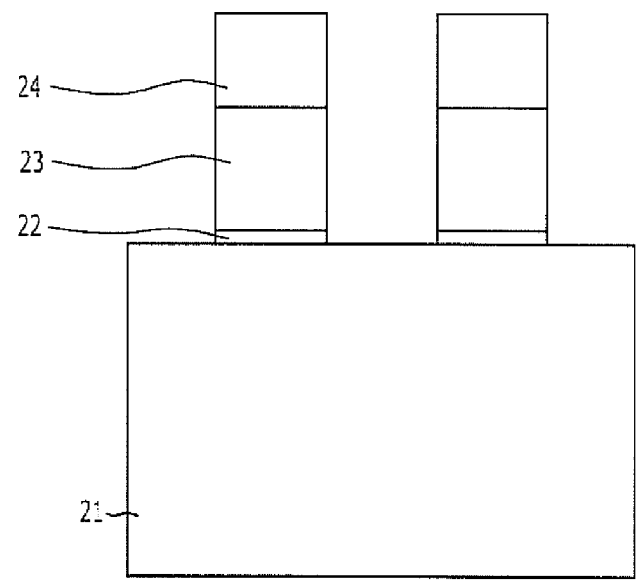
FIGS. 2A to 2O are cross-sectional views illustrating a process for fabricating a semiconductor device in accordance with an exemplary embodiment of the present invention.
Figure 2B:
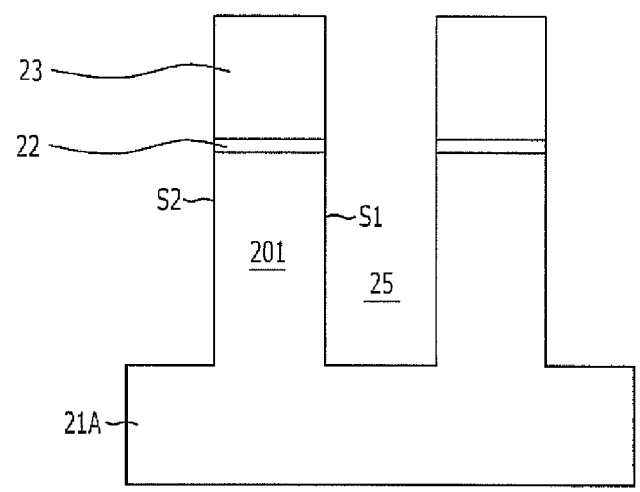
Figure 2C:
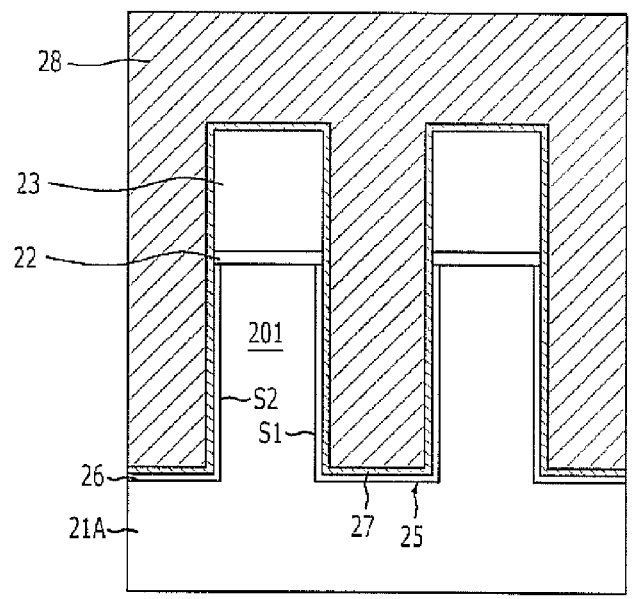
Figure 2D:
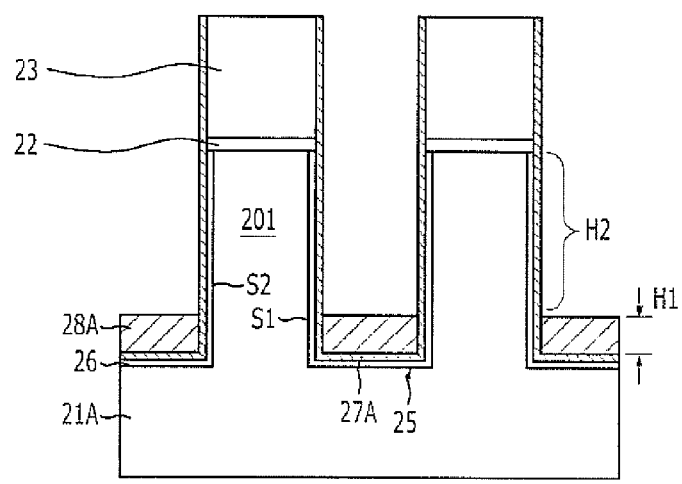
Figure 2E:
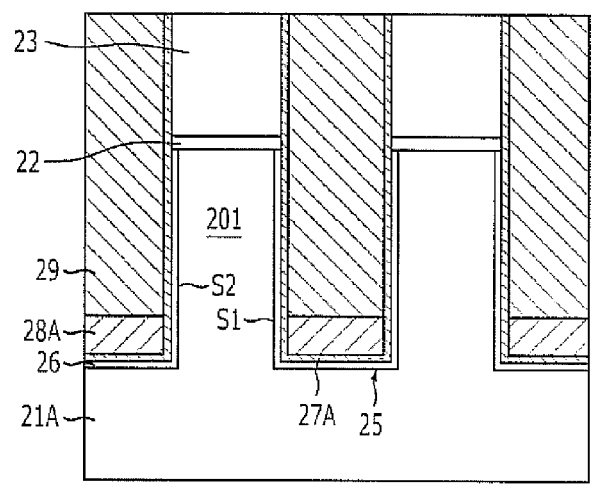
Figure 2F:
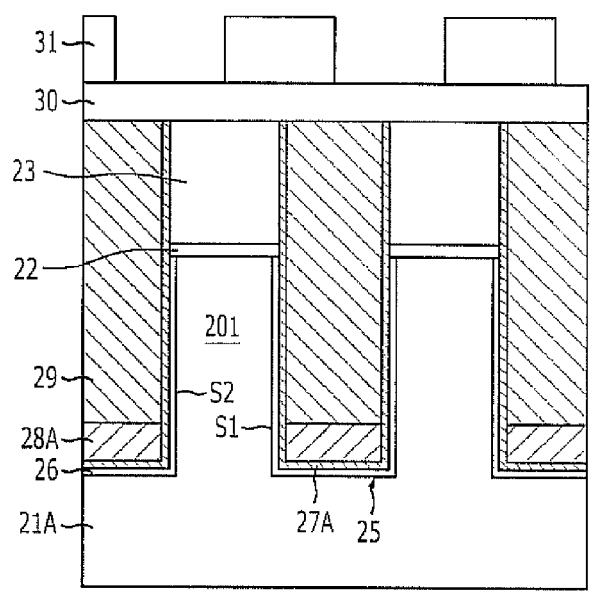
Figure 2G:
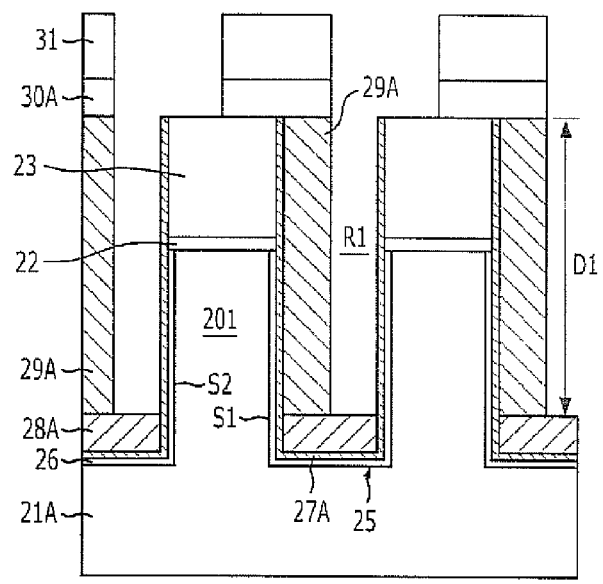
Figure 2H:
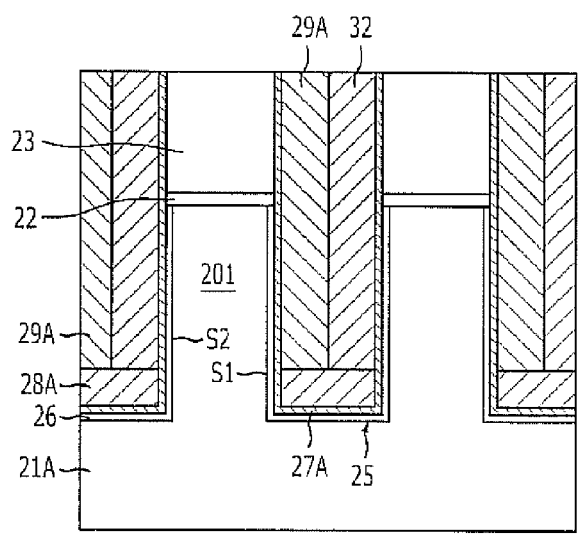
Figure 2I:
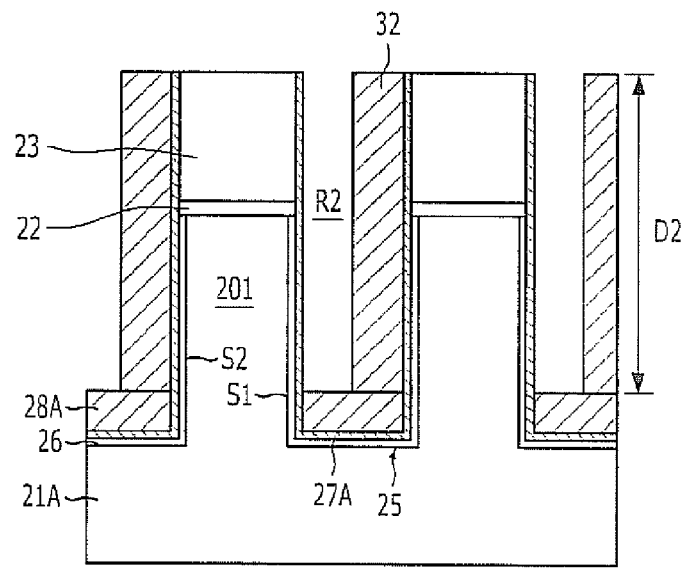
Figure 2J:
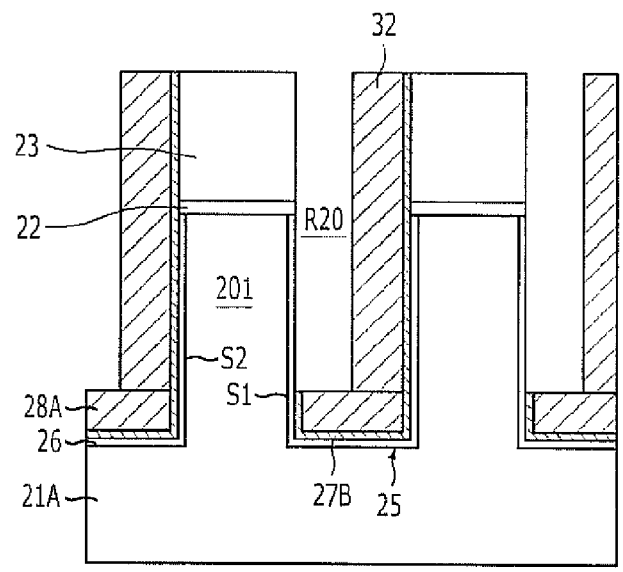
Figure 2K:
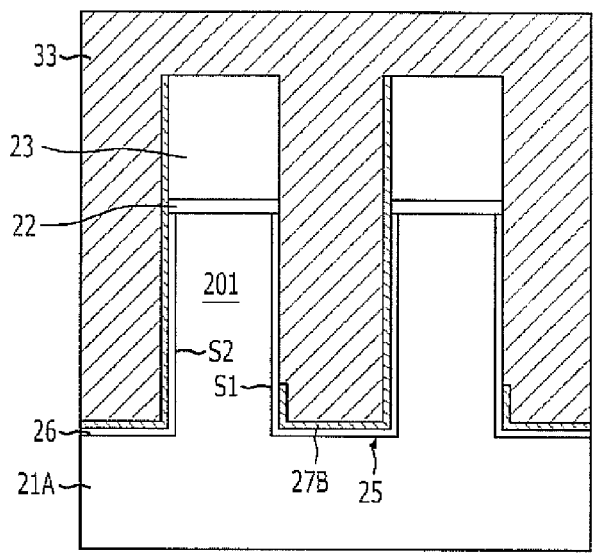
Figure 2L:
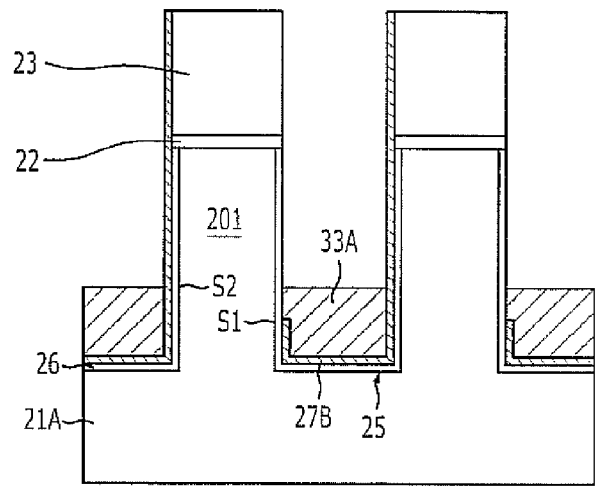
Figure 2M:
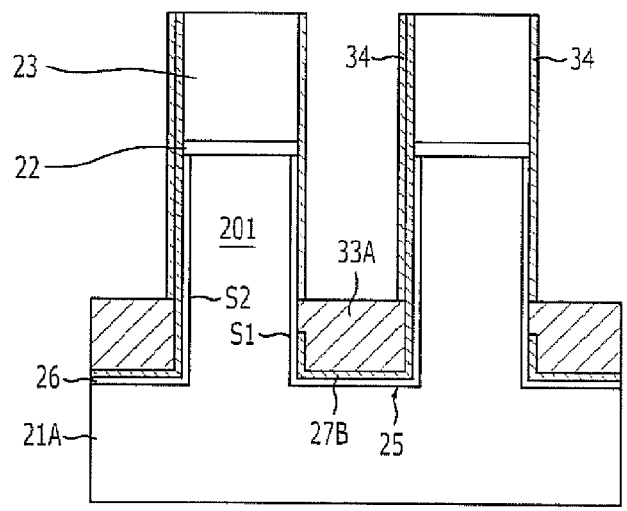
Figure 2N:
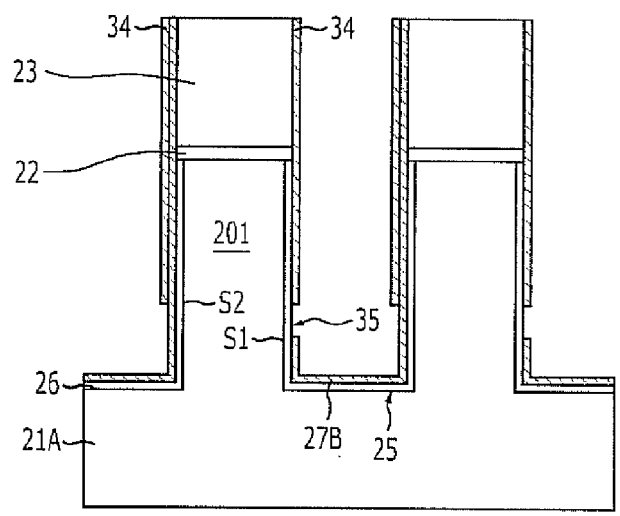
Figure 2O:
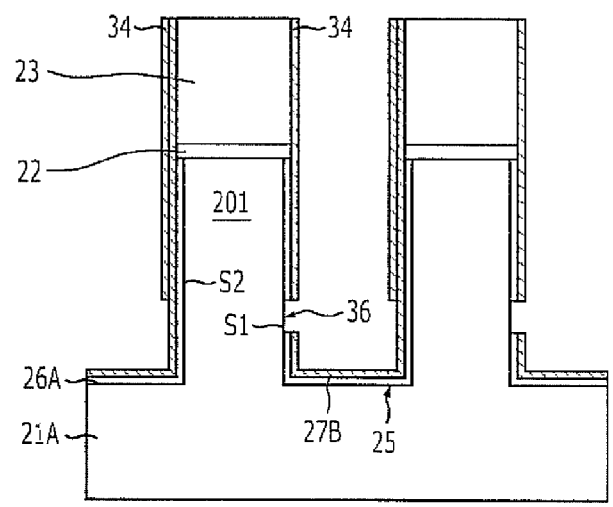

FIGS. 2A to 2O are cross-sectional views illustrating a process for fabricating a semiconductor device in accordance with an exemplary embodiment of the present invention.

Referring to FIG. 2A, a stacked pattern structure, including a first hard mask (HM) pattern 23 stacked on a pad oxide pattern 22, is formed over a semiconductor substrate 21. The semiconductor substrate 21 includes a silicon substrate. The first hard mask pattern 23 may include an oxide layer or a nitride layer, or it may have a stacked structure where a nitride layer and an oxide layer are stacked. For example, a hard mask nitride layer and a hard mask oxide layer may be stacked sequentially to form the first hard mask pattern 23.

The first hard mask pattern 23 and the pad oxide pattern 22 are formed through an etch process using a first photoresist pattern 24. The first photoresist pattern 24 is patterned in a line type pattern in which photoresist forms parallel lines of equal or varying widths separated by equal or varying gaps. The first photoresist pattern 24 may be referred to as a buried bit line (BBL) mask as well.

Since the first hard mask pattern 23 takes the shape of the first photoresist pattern 24, the first hard mask pattern 23 is patterned in a line type pattern as well.

Referring to FIG. 2B, a trench etch process is performed using the first hard mask pattern 23 as an etch barrier after the first photoresist pattern 24 is stripped. To be specific, the semiconductor substrate 21 is etched to a certain depth by using the first hard mask pattern 23 as an etch barrier to thereby form a trench 25. A plurality of active regions 201 are formed by the trench 25, and the plurality of the active regions 201 are isolated one from another by the trench 25.

The trench etch process may be referred to as a buried bit line (BBL) trench etch as well.

Since the trench 25 is formed by using the first hard mask pattern 23, which takes the shape of the first photoresist pattern 24, the trench 25 is patterned in a line type pattern too.

The trench etch process may be an anisotropic etch process. When the semiconductor substrate 21 is a silicon substrate, the anisotropic etch process may be a plasma dry etch process using chlorine ($Cl_2$) gas, hydrogen bromide (HBr) gas, or a mixed gas thereof.

Since the active regions 201 are formed by using the first hard mask pattern 23, which has the shape of the first photoresist pattern 24, they are patterned in a line type pattern too. Accordingly, the active regions 201 are line-type pillars, and neighboring active regions 201 are isolated one from another by the line-type trenches 25.

Through the trench etch process, the plurality of active regions 201, which are extended in one direction and isolated from each other by the trenches 25, are formed over the etched semiconductor substrate 21A. Each of the active regions 201 has a first sidewall S1 and a second sidewall S2.

Referring to FIG. 2C, an insulation layer covering both sidewalls of each active region 201 is formed. In this embodiment, the insulation layer has a stacked structure where a liner oxide layer 26 and a first liner nitride layer 27 are sequentially stacked. The liner oxide layer 26 may be formed by performing a sidewall oxidation process, and the first liner nitride layer 27 may be formed in an atmosphere of dichlorosilane (DCS) and ammonia (NH3) at a temperature of approximately 600° C. to approximately 800° C. under the pressure of approximately 0.1 Torr to approximately 6 Torr.

Subsequently, a first undoped polysilicon layer 28 gap-filling the trenches 25 between the active regions 201 is formed over the first liner nitride layer 27. Herein, the first undoped polysilicon layer 28 serves as an etch stop layer during a subsequent recess process.

Referring to FIG. 2D, a chemical mechanical polishing (CMP) process and an etch-back process are sequentially performed onto the first undoped polysilicon layer 28. More specifically, first planarization is performed using the CMP method to planarize the first undoped polysilicon layer 28 and the portions of the first liner nitride layer 27 covering top portions of the first hard mask pattern 23. Therefore, a slurry using a high selectivity with respect to the first hard mask pattern 23, which is a nitride layer, is applied. Next, the etch-back process is performed in which a chemical compound based on hydrogen bromide (HBr), sulfur hexafluoride ($SF_6$), or chlorine ($Cl_2$) is used. It is also possible that the chemical compound additionally includes oxygen ($O_2$), nitrogen ($N_2$), Helium (He), or argon (Ar). Further, a wet cleaning using ammonium hydroxide ($NH_4OH$), sulfuric acid ($H_2SO_4$), or hydrogen peroxide ($H_2O_2$) may be performed to remove residues remaining after the etch-back process. As a result, a first undoped polysilicon pattern 28A is formed. Hereafter, the first undoped polysilicon pattern 28A will be referred to as an etch stop layer 28A. Also, a first liner nitride pattern 27A is acquired when a portion of the first liner nitride layer 27 on the upper portion of the first hard mask pattern 23 is removed during the CMP process.

As a result of the CMP process and the etch-back process sequentially performed as described above, the etch stop layer 28A comes to be formed between the active regions 201 with a first height H1. More specifically, the first height H1 is the height of the etch stop layer 28A above the first liner nitride pattern 27A in a direction perpendicular to the etched semiconductor substrate 21A. Herein, a second height H2 is a height of an exposed portion of the first liner nitride pattern 27A on the sidewalls of each active region 201. Thus, the second height H2 depends on the first height H1. The first height H1 may be lower than the second height H2.

With the etch stop layer 28A formed as described above, it is possible to compensate, in advance, for the depth of a side contact to be formed subsequently.

Referring to FIG. 2E, a sacrificial layer is formed over the semiconductor substrate 21A until the trenches 25 are filled. Then, a CMP process is performed onto the sacrificial layer for planarization until a surface of the first hard mask pattern 23 is exposed.

Consequently, the sacrificial layer 29 has a form gap-filling the space above the etch stop layer 28A between the active regions 201. The sacrificial layer 29 may include an oxide layer. Also, since the aspect ratio of the active regions 201 is high, the oxide layer can be formed by performing a spin on coating process.

Referring to FIG. 2F, a second hard mask layer 30 is formed over the resultant structure, including the sacrificial layer 29, and then a second photoresist pattern 31 is formed using a photoresist layer. The second hard mask layer 30 may include a carbon layer. The second photoresist pattern 31 is used as a mask for exposing any one sidewall of each active region 201 during a subsequent etch process. The mask that subsequently permits any one sidewall of an active region to be exposed may be referred to as a one sidewall contact (OSC) mask.

Referring to FIG. 2G, a second hard mask pattern 30A is formed by etching the second hard mask layer 30 by using the second photoresist pattern 31 as an etch barrier. Subsequently, the sacrificial layer 29 is etched using the second hard mask pattern 30A as an etch barrier.

As a result of etching the sacrificial layer 29, a first recess R1 which exposes the first liner nitride pattern 27A on any one sidewall of the active region 201 is formed. For example, as shown in FIG. 2G, the first recess R1 may expose the first liner nitride pattern 27A on the second sidewall S2. The first recess R1 is defined by the first liner nitride pattern 27A, the etch stop layer 28A, and a sacrificial pattern 29A. To be specific, the first recess R1 includes a first sidewall, a second sidewall, and a bottom surface. The first sidewall of the first recess R1 is provided by the first liner nitride pattern 27A, and the second sidewall of the first recess R1 is provided by the sacrificial pattern 29A. The bottom surface of the first recess R1 is provided by the etch stop layer 28A.

The etch process for forming the first recess R1 may be a dry etch process. In particular, where the sacrificial layer 29 is an oxide layer, and the first hard mask pattern 23 and the first liner nitride pattern 27A are nitride layers, it is possible to perform a self-aligned etch process. Also, where the etch stop layer 28A is an undoped polysilicon layer, the self-aligned etch process can stop at the surface of the etch stop layer 28A. The etch process for forming the first recess R1 may also be a plasma etch process using a fluorocarbon-based gas, such as $C_xF_y$ or $C_xH_yF_z$, because the sacrificial layer 29 is an oxide layer. Also, a vertical etch profile of the first recess R1 may be acquired by adding an additional gas, such as oxygen ($O_2$), nitrogen ($N_2$), Helium (He), or argon (Ar). Further, to remove residues remaining after the dry etch process, a stripping process and a wet etch process may be performed. The stripping process may apply plasma using microwaves and may use a mixed gas of $N_2$, $O_2$ and hydrogen ($H_2$) (e.g., $N_2/O_2/H_2$). The wet etch process may use ammonium hydroxide ($NH_4OH$), sulfuric acid ($H_2SO_4$), or hydrogen peroxide ($H_2O_2$).

As described above, when the self-aligned etch process is performed in such a manner that the etch process stops at the etch stop layer 28A, the etch process can be sufficiently performed. Therefore, the first recess R1 may be formed with a uniform depth D1.

Referring to FIG. 2H, a cleaning process may be performed and the second hard mask pattern 30A is removed.

Subsequently, the first recess R1 is gap-filled using a second undoped polysilicon layer and then a CMP process may be performed to expose the first hard mask pattern 23. The CMP process uses a slurry having high selectivity with respect to the first hard mask pattern 23.

Also, to remove the residue remaining after the CMP process, a wet cleaning process using $NH_4OH$, $H_2SO_4$, or $H_2O_2$ may be performed.

Accordingly, a second undoped polysilicon layer 32 gap-filling the first recess R1 is formed. Hereafter, the second undoped polysilicon layer 32 will be referred to as an etch barrier 32. The etch barrier 32 is formed of undoped polysilicon similar to the etch stop layer 28A. The etch barrier 32 functions as an etch barrier when the sacrificial pattern 29A is subsequently removed.

Referring to FIG. 2I, the sacrificial pattern 29A is removed to form a second recess R2. For example, the sacrificial pattern 29A may be removed through a wet cleaning process.

The second recess R2 exposes the first liner nitride pattern on any one sidewall of each active region 201. For example, as shown in FIG. 2I, the second recess R2 exposes the first liner nitride pattern 27A formed on the first sidewall S1. The second recess R2 is defined by the first liner nitride pattern 27A, the etch stop layer 28A, and the etch barrier 32. To be specific, the second recess R2 includes a first sidewall, a second sidewall, and a bottom surface. The first sidewall of the second recess R2 is provided by the first liner nitride pattern 27A, and the second sidewall of the second recess R2 is provided by the etch barrier 32. The bottom surface of the second recess R2 is provided by the etch stop layer 28A.

The wet cleaning process for removing the sacrificial pattern 29A may use hydrogen fluoride (HF) or a HF-based chemical compound, such as buffered oxide etchant (BOE). During the wet cleaning process, the etch stop layer 28A and the etch barrier 32, which are formed of the undoped polysilicon, are not removed. In short, the etch barrier 32 and the etch stop layer 28A serve as etch barriers during the removal of the sacrificial pattern 29A.

As described above, although the width of the second recess R2 without the sacrificial pattern 29A may not be uniform, the depth D2 may be uniform. The depth D2 of the second recess R2 is the same as the depth D1 of the first recess R1. Since the uniform depth D2 can be acquired through a damascene process, a clean bottom surface of the second recess R2 can be obtained. In other words, because the etch process can be sufficiently performed until the etch process stops at the etch stop layer 28A, the bottom surface of the second recess R2 can be sufficiently clean.

The damascene process refers to a process for forming the second recess R2 by forming the sacrificial pattern 29A, forming the first recess R1, forming the etch barrier 32, and removing the sacrificial pattern 29A.

Referring to FIG. 2J, a portion of the first liner nitride pattern 27A exposed by the second recess R2 is removed through a cleaning process. That is, a portion of the first liner nitride pattern 27A, not protected by the etch stop layer 28A and the etch barrier 32, is removed. The portion of the first liner nitride pattern 27A remaining after the cleaning process will be referred to as cleaned first liner nitride pattern 27B, hereafter. The cleaning process used for forming the cleaned first liner nitride pattern 27B may remove the liner oxide layer 26. In order to maintain the liner oxide layer 26 on both sidewalls of each active region 201, a wet cleaning process may be performed or a dry cleaning process, having selectivity with respect to the undoped polysilicon layer, may be performed.

When a portion of the first liner nitride pattern 27A is removed, the width of the second recess R2 is extended. Hereafter, the second recess R2 with extended width will be referred to as width-extended second recess R20. The width-extended second recess R20 has a width extended by the thickness of the first liner nitride pattern 27A.

Referring to FIG. 2K, after the etch stop layer 28A and the etch barrier 32 are removed, a third undoped polysilicon layer 33 is formed over the resultant structure to fill the space between the active regions 201.

Referring to FIG. 2L, the third undoped polysilicon layer 33 may be planarized through a method such as CMP until a surface of the first hard mask pattern 23 is exposed. The third undoped polysilicon layer 33 is etched-back so that the third undoped polysilicon layer 33 remains to have a certain height. As a result, the third undoped polysilicon pattern 33A with a certain height is formed. Particularly, the height of a the third undoped polysilicon pattern 33A is such that a portion of the third undoped polysilicon pattern 33A contacts a portion of the liner oxide layer 26 so that a side contact can be subsequently formed.

Referring to FIG. 2M, a second liner nitride layer is formed over the resultant structure and then the second liner nitride layer is selectively etched to expose a surface of the third undoped polysilicon pattern 33A. Hereafter, the etched second liner nitride layer will be referred to as a second liner nitride pattern 34.

As a result, a double insulation layer structure of the liner oxide layer 26 and the second liner nitride pattern 34 is formed on one of the sidewalls (e.g., the first sidewall S1 in FIG. 2M) of the active region 201, above where the third undoped polysilicon pattern 33A contacts the liner oxide layer 26. On the other sidewall (e.g., the second sidewall 52 in FIG. 2M) of the active region 201, where the third undoped polysilicon pattern 33A does not contact the liner oxide layer 26, a triple insulation layer structure of the liner oxide layer 26, the cleaned first liner nitride pattern 27B, and the second liner nitride pattern 34 is formed. In a region where a side contact is to be formed, only the liner oxide layer 26 exists between the active region 201 and the third undoped polysilicon pattern 33A.

The third undoped polysilicon pattern 33A serves as an etch barrier when the second liner nitride pattern 34 is etched back.

Referring to FIG. 2N, the third undoped polysilicon pattern 33A is removed. Accordingly, an opening 35 is revealed to open a portion of one of the sidewalls (e.g., the first sidewall S1 in FIG. 2N) of the active region 201. Although not shown in FIG. 2N, the opening 35 extends along the active region 201 in a direction perpendicular to the cross-section of FIG. 2N.

Herein, the opening 35 is a space contacting the liner oxide layer 26 between the cleaned first liner nitride pattern 27B and the second liner nitride pattern 34.

Referring to FIG. 2O, the liner oxide layer 26 exposed by the opening 35 is selectively removed. As a result, a side contact 36 which exposes a portion of any one sidewall of the active region 201 (e.g., a portion of the first sidewall S1 in FIG. 2O) is formed. Although not shown in FIG. 2O, the side contact 36 extends along the active region 201 in a direction perpendicular to the cross-section of FIG. 2O. The liner oxide layer 26 may be removed through a cleaning process in order to form the side contact 36. For example, when a wet cleaning process is performed using HF or BOE, the liner oxide layer 26 may be selectively removed without damaging neighboring liner nitride layers (i.e., the cleaned first liner nitride pattern 27B and the second liner nitride pattern 34). After the side contact 36 is formed, the remaining portions of the liner oxide layer 26, which will be referred to as a liner oxide pattern 26A, may expose a portion of one of the sidewalls (e.g., the first sidewall S1 in FIG. 2O) of the active region 201.

Figure 3:
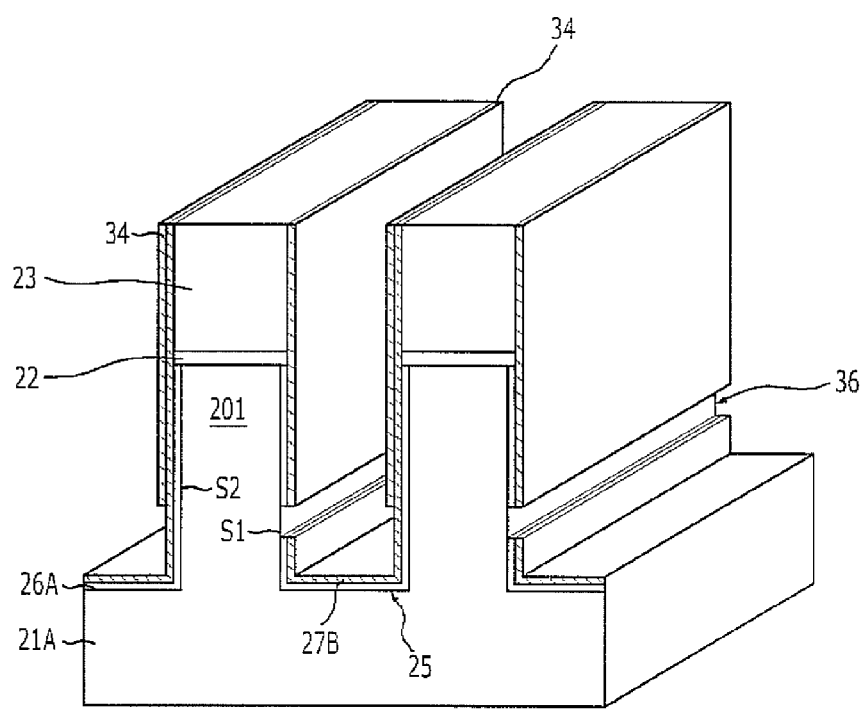
FIG. 3 is a perspective view of the semiconductor device shown in FIG. 2O.

FIG. 3 is a perspective view of the semiconductor device shown in FIG. 2O. As shown in FIG. 3, the side contact 36 is an opening in the shape of a line, which extends on a sidewall of each of the active regions 201 in a direction approximately parallel to the semiconductor substrate 21A. The side contact 36 exposes a portion of one sidewall (e.g., a portion of the first sidewall S1 in FIG. 3) of the active region 201.

As described above, the technology of the present invention includes a side contact 36 that exposes any one sidewall from among the two sidewalls of the active region 201.

To form the side contact 36, processes are performed in the sequence of forming the sacrificial pattern 29A, forming the first recess R1, forming the etch barrier 32, and forming the second recess R2. Herein, the process of forming the second recess R2 by filling the first recess R1 with the etch barrier 32 and removing the sacrificial pattern 29A is referred to as damascene process. Also, since the process of forming the first recess R1 uses self-aligned etching, the process may be called a 'self-aligned damascene process.'

When the second recess R2 is formed through the self-aligned damascene process, the depth of the second recess R2 becomes uniform. Accordingly, the position where the side contact 36 is to be formed and the depth of the side contact 36 can be uniform.

Meanwhile, in a method of fabricating a semiconductor device similar to a semiconductor device fabricated according to an exemplary embodiment of the present invention, an undoped polysilicon layer may be deposited and a mask process and an etch process may be performed in order to form the shape of the second recess R2.

Figure 4:
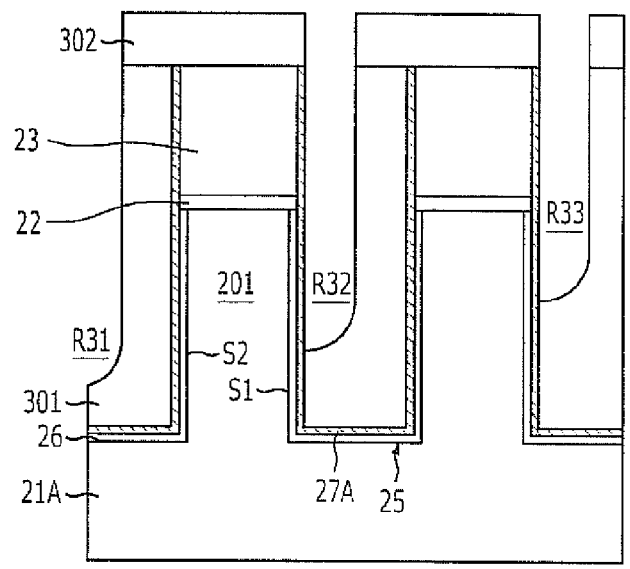
FIG. 4 is a cross-sectional view illustrating a concern in fabricating a semiconductor device similar to a semiconductor device fabricated according to an exemplary embodiment of the present invention.

FIG. 4 is a cross-sectional view illustrating a concern in fabricating a semiconductor device similar to a semiconductor device fabricated according to an exemplary embodiment of the present invention.

According to a similar fabrication method described in FIG. 4, after an undoped polysilicon layer 301 filling the gap between the active regions 201 is formed, second recesses R31, R32, and R33 can be formed by etching the undoped polysilicon layer 301 using the mask 302 and an etch process. Herein, the etch process includes a typical dry etch process.

However, the dry etch process performed in a similar fabrication method shown in FIG. 4 illustrates concerns that the second recesses may not be formed due to an overlay problem during the mask 302 process or that even if the second recesses are formed, the depths of the second recesses may not be uniform. As shown, second recesses R31, R32 and R33 may have various depths. If the depths of the second recesses are not uniform, the position of a subsequently formed side contact becomes irregular. Also, since there is no etch stop layer for limiting the extent of the etching during the dry etch process in a method of fabricating shown in FIG. 4, it is not only difficult to form the second recesses with a uniform depth, but it is also difficult to obtain second recesses with vertical profiles.

The first sidewall S1 of the active region 201 exposed by the side contact 36 in accordance with an exemplary embodiment of the present invention is a region where a junction region is to be formed through a subsequent process and the side contact 36 is a region where the junction region contacts a buried bit line. The side contact 36 is filled with metal silicide to thereby form an Ohmic-like contact between the junction region and the buried bit line.

FIGS. 5A to 5D are cross-sectional views illustrating a process of forming a junction region in accordance with an exemplary embodiment of the present invention.

Figure 5A:
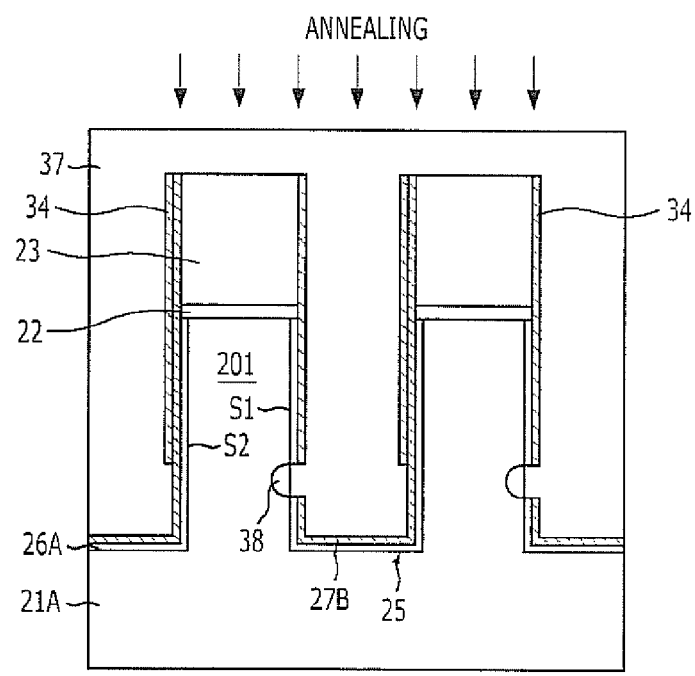
FIGS. 5A to 5D are cross-sectional views illustrating a process of forming a junction region in accordance with an exemplary embodiment of the present invention.

After the side contact 36 is formed by performing the process up to the process shown in FIG. 2O, a dopant providing layer 37 is formed to fill the space between the active regions 201, as illustrated in FIG. 5A. Herein, the dopant providing layer 37 is doped with a dopant for forming the junction region. The dopant providing layer 37 includes an insulation layer or a doped polysilicon layer. The insulation layer may include a phosphorous silicate glass substrate having excellent fluidity and doped with a dopant of a predetermined concentration or more. When the fluidity is high, it is possible to perform a void-free gap-fill. Accordingly, dose uniformity of a subsequent junction region is excellent. The dopant used for doping the dopant providing layer 37 may include an N-type impurity, such as phosphorus (P). The dopant providing layer 37 may be formed through a Chemical Vapor Deposition (CVD) process.

Subsequently, annealing is performed. Herein, a junction region 38 is formed as the dopant used for doping the dopant providing layer 37 is diffused into the inside of a sidewall (e.g., the first sidewall S1 in FIG. 5A) of the active region 201 exposed by the side contact 36. Where the dopant used for doping the dopant providing layer 37 is an N-type impurity, the junction region 38 becomes an N-type junction.

The annealing process may be performed in a furnace and the annealing process may be performed at a temperature ranging from approximately 500° C. to approximately 1,200° C.

As described above, since the junction region 38 is formed by forming the dopant providing layer 37 and causing thermal diffusion through the annealing process, it is easy to control the depth of the junction region 38 and the concentration of the dopant.

Figure 5B:
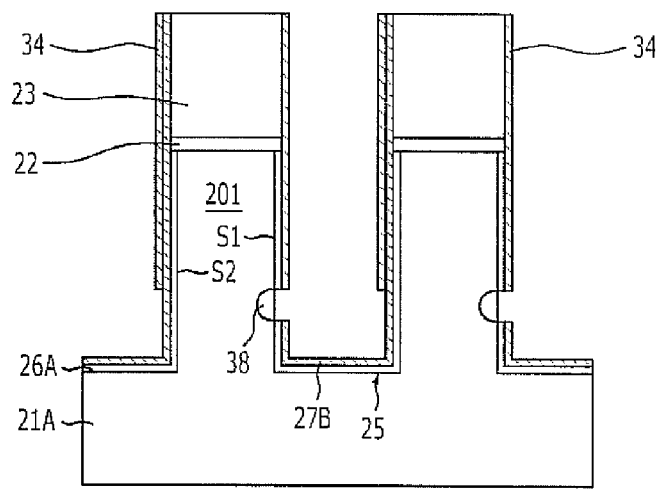

Referring to FIG. 5B, the dopant providing layer 37 is removed. The dopant providing layer 37 may be removed through a wet etch process or a dry etch process. When the dopant providing layer 37 is a polysilicon layer, the dry etch process may be performed using a HBr or $Cl_2$-based compound. Further, to obtain a more vertical profile $O_2$, $N_2$, He, or Ar may be added to the compound. When the wet etch process is performed, a cleaning solution taking advantage of the high selectivity of the dopant providing layer 37 with respect to a nitride layer and an oxide layer is used.

Figure 5C:
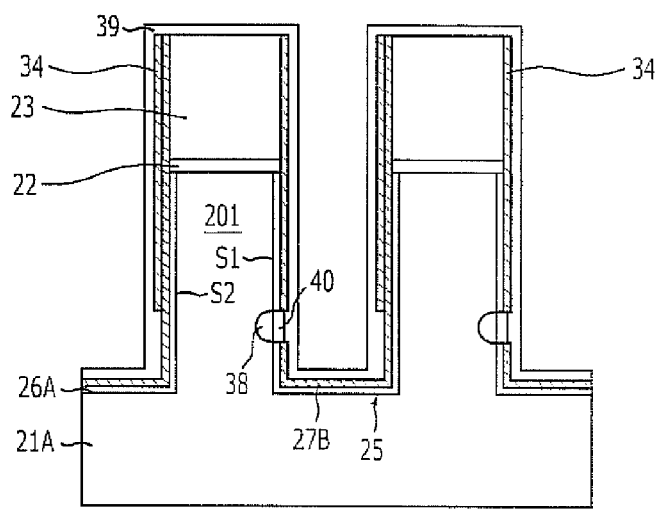

Referring to FIG. 5C, after a barrier metal 39 is formed, annealing is performed to thereby form a metal silicide 40. The barrier metal 39 may be formed by stacking a titanium (Ti) layer and a titanium nitride (TiN) layer. Therefore, the metal silicide 40 may include a titanium silicide (Ti-silicide) layer. Alternatively, for example, the metal silicide 40 may include nickel silicide. The metal silicide 40 contributes to the Ohmic-like contact between the buried bit line and the junction region 38.

Figure 5D:
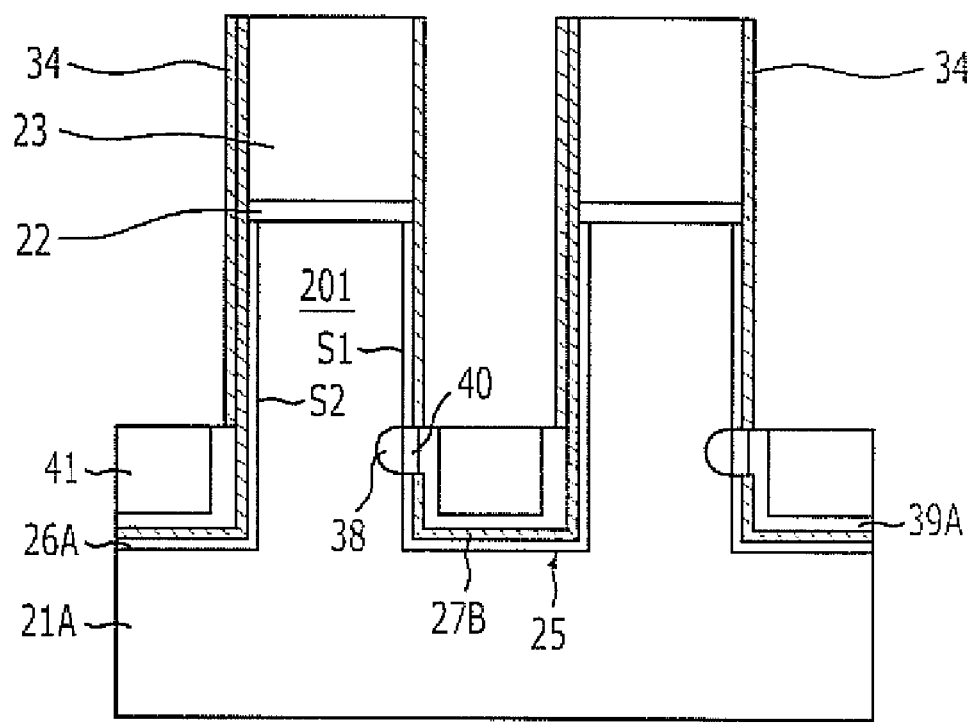

Referring to FIG. 5D, a bit line conductive layer is deposited over the barrier metal 39 to fill the gap between the active regions 201 and the bit Line conductive layer is etched-back. The bit line conductive layer may be etched back to various heights so long as it contacts the metal silicide 40. Accordingly, a buried bit line 41 coupled to the junction region 38 through the metal silicide 40 is formed. Herein, although not shown, the buried bit line 41 is arranged parallel to the active region 201. The barrier metal 39 is simultaneously etched-back when the bit line conductive layer is etched-back. Hereafter, the remaining barrier metal 39 will be referred to as barrier metal pattern 39A. The height of the buried bit line 41 may be controlled according to the height of the metal silicide 40. Portions of the buried bit line 41, except for the portion coupled to the metal silicide 40, are insulated from the semiconductor substrate 21A by the liner oxide pattern 26A and the cleaned first liner nitride pattern 27B.

As described above, since the buried bit line 41 is formed of metal, the resistance is low. Also, since only one buried bit line 41 is coupled to one junction region 38, exemplary embodiments of the present invention are favorable for high integration.

The technology of the present invention described above with reference to exemplary embodiments can form a side contact which selectively exposes any one sidewall of an active region at a desired position in a uniform depth by forming an etch stop layer and forming a recess having excellent depth uniformity through a self-aligned etch process and a damascene process.

Accordingly, it is possible to form a junction region, having a uniform depth and dose, on any one sidewall of an active region exposed by the side contact.

While the present invention has been described with respect to the specific exemplary embodiments, it will be apparent to those skilled in the art that various changes and modifications may be made without departing from the spirit and scope of the invention as defined in the following claims.

What is claimed is:

1. A method for fabricating a semiconductor device, comprising:
   forming a plurality of active regions, each having a first sidewall and a second sidewall, by etching a semiconductor substrate, wherein the active regions are extended in one direction and isolated from each other by a line-type trench;
   forming an insulation layer on the first sidewall and the second sidewall;
   forming an etch stop layer filling a portion of each gap between the active regions;
   exposing the insulation layer formed on any one sidewall from among the first sidewall and the second sidewall; and
   forming a side contact exposing a portion of any one sidewall from among the first sidewall and the second sidewall by selectively removing a portion of the insulation layer, wherein the side contact is an opening in the shape of a line, which extends on the first sidewall or the second sidewall of each of the active regions;
   wherein the exposing of the insulation layer comprises:
      forming a sacrificial layer filling a gap over the etch stop layer;
      forming a first recess by performing an etch process onto a portion of the sacrificial layer in such a manner that the etch process stops at the etch stop layer;
      forming an etch barrier filling the first recess; and
      forming a second recess exposing the insulation layer formed on any one sidewall from among the first sidewall and the second sidewall by removing the sacrificial layer.

2. The method of claim 1, wherein the etch process performed onto the portion of the sacrificial layer is a self-aligned etch.

3. The method of claim 1, wherein the sacrificial layer fills the gap using a spin on coating process.

4. The method of claim 1, wherein the sacrificial layer includes an oxide layer, and the etch stop layer includes an undoped polysilicon layer.

5. The method of claim 1, wherein the etch stop layer and the etch barrier include an undoped polysilicon layer.

6. The method of claim 1, wherein the insulation layer is formed by sequentially forming a liner oxide layer and a liner nitride layer.

7. The method of claim 4, wherein the forming of the first recess comprises:
performing a dry etch process using a fluorocarbon (HF)-based gas; and
sequentially performing a stripping process and a wet etch process.

8. The method of claim 7, wherein the dry etch process is performed by adding any one additional gas selected from the group consisting of oxygen ($O_2$), nitrogen ($N_2$), Helium (He), and argon (Ar).

9. The method of claim 4, wherein the second recess is formed through a wet cleaning process using a HF-based compound.

10. A method for fabricating a semiconductor device, comprising:
forming a plurality of active regions, each having a first sidewall and a second sidewall, by using a hard mask pattern as an etch barrier and etching a semiconductor substrate, wherein the active regions are extended in one direction and isolated from each other by a line-type trench;
forming an insulation layer on the first sidewall and the second sidewall;
forming an etch stop layer filling a portion of each gap between the active regions;
forming a sacrificial layer filling a gap over the etch stop layer;
forming a sacrificial pattern providing a first recess by etching a portion of the sacrificial layer;
forming an etch barrier filling the first recess;
exposing the insulation layer formed on any one sidewall from among the first sidewall and the second sidewall by removing the sacrificial pattern; and
forming a side contact exposing a portion of any one sidewall from among the first sidewall and the second sidewall by selectively removing a portion of the insulation layer, wherein the side contact is an opening in the shape of a line, which extends on the first sidewall or the second sidewall of each of the active regions.

11. The method of claim 10, wherein the sacrificial pattern providing the first recess is formed using a self-aligned etch between the hard mask pattern and the sacrificial layer.

12. The method of claim 10, wherein the etch stop layer and the etch barrier include an undoped polysilicon layer.

13. The method of claim 10, wherein the insulation layer is formed by sequentially forming a liner oxide layer and a liner nitride layer.

14. The method of claim 11, wherein the sacrificial layer includes an oxide layer, and the hard mask pattern includes a nitride layer.

15. The method of claim 14, wherein the oxide layer is formed through a spin on coating process.

16. The method of claim 14, wherein the forming of the sacrificial pattern providing the first recess comprises:
performing a dry etch process using a fluorocarbon (HF)-based gas; and
sequentially performing a stripping process and a wet etch process.

17. The method of claim 14, wherein the second recess is formed through a wet cleaning process using a HF-based compound.

18. The method of claim 16, wherein the dry etch process is performed by adding any one additional gas selected from the group consisting of oxygen ($O_2$), nitrogen ($N_2$), Helium (He), and argon (Ar).

* * * * *